United States Patent
Masuda (10) Patent No.: US 6,671,201 B2
(45) Date of Patent: Dec. 30, 2003

(54) METHOD FOR WRITING DATA INTO A SEMICONDUCTOR MEMORY DEVICE AND SEMICONDUCTOR MEMORY THEREFOR

(75) Inventor: Kengo Masuda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/113,192

(22) Filed: Apr. 1, 2002

(65) Prior Publication Data

US 2003/0185043 A1 Oct. 2, 2003

(30) Foreign Application Priority Data

Apr. 2, 2001 (JP) ........................................ 2001-103485

(51) Int. Cl.[7] .............................................. G11C 11/00
(52) U.S. Cl. ...................................... 365/154; 365/202
(58) Field of Search .................................. 365/154, 202

(56) References Cited

U.S. PATENT DOCUMENTS 4,193,128 A * 3/1980 Brewer ........................ 365/228

FOREIGN PATENT DOCUMENTS

JP 11-045579 2/1999

OTHER PUBLICATIONS

English Bibliography and Abstract of JP 11–045579 (cited above).

* cited by examiner

*Primary Examiner*—M. Tran
(74) *Attorney, Agent, or Firm*—Darryl G. Walker; Bradley T. Sako (57) ABSTRACT

A method of writing data into a semiconductor memory device including a memory cell to which a power supply potential and a ground potential are provided is disclosed. The method may include generating a negative voltage (GNDL) lower than the ground potential and providing complementary data signals to a bit line pair when writing data to a memory cell wherein the low one of the complementary data signals is essentially the negative voltage. In this way, compensation for a potential increment which may be caused due to a wiring resistance, or the like, of a bit line (BL1) may be provided.

20 Claims, 4 Drawing Sheets

METHOD FOR WRITING DATA INTO A SEMICONDUCTOR MEMORY DEVICE AND SEMICONDUCTOR MEMORY THEREFOR

TECHNICAL FIELD

The present invention relates generally to a method for writing data into a semiconductor memory device and more particularly to a method for writing data into a semiconductor memory device such as a SRAM (static random access memory) that may include a memory cell operating at a relatively low voltage.

BACKGROUND OF THE INVENTION

It is a continuing goal to improve the bit density and decrease power consumption in a semiconductor memory device. One method of increasing the bit density is to decrease the size of the memory cell. In a SRAM (static random access memory), the size of the memory cell may be decreased by including memory cell transistors having a smaller size.

In order to decrease power consumption and improve breakdown reliability of memory cells having small sizes, memory cells receive a relatively low power supply voltage. For example, in a SRAM having memory cells configured with MOS (metal oxide semiconductor) transistors, the memory cells may operate using a power supply voltage as low as 1.2 V.

A configuration of a conventional SRAM will now be discussed.

Figure 4:
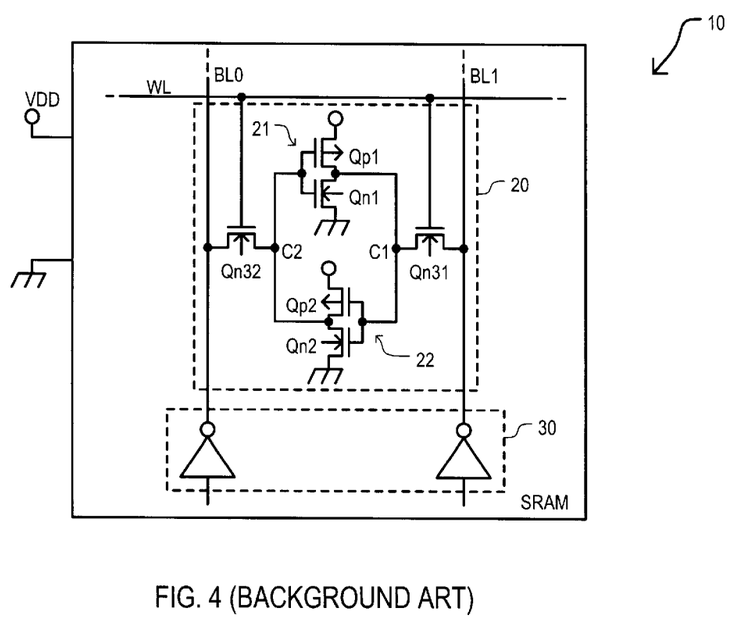
FIG. 4 is a circuit schematic diagram illustrating a portion of a conventional SRAM.

FIG. 4 is a circuit schematic diagram illustrating a portion of a conventional SRAM given the general reference character 10.

Referring to FIG. 4, conventional SRAM 10 has a memory cell 20. Memory cell 20 stores a data logic value. Although not shown, conventional SRAM includes an array (matrix) of memory cells 20 arranged in rows and columns. Conventional SRAM 10 includes a write circuit 30 for writing data into memory cell 20. A word line WL is connected to a row of memory cells 20. Bit lines (BL0 and BL1) are connected to a column of memory cells 20 and write circuit 30. Although not shown, a plurality of bit lines and a plurality of word lines are included that respectively connect columns and rows of memory cells.

Memory cell 20 includes inverters (21 and 22) and transfer gates (Qn31 and Qn32). Inverter 21 has an input connected to node C2 and an output connected to node C1. Inverter 22 has an input connected to node C1 and an output connected to node C2. In this way, inverters (21 and 22) form a bi-stable flip-flop that stores a data value and inverted data value at respective nodes (C1 and C2).

Inverters (21 and 22) are CMOS (complementary MOS) type inverters. Inverter 21 includes a NMOS transistor Qn1 and a PMOS transistor Qp1. NMOS transistor Qn1 has a source connected to ground, a drain connected to node C1 and a gate connected to node C2. PMOS transistor Qp1 has a source connected to an array power supply, a drain connected to node C1 and a gate connected to node C2. Inverter 22 includes a NMOS transistor Qn2 and a PMOS transistor Qp2. NMOS transistor Qn2 has a source connected to ground, a drain connected to node C2 and a gate connected to node C1. PMOS transistor Qp2 has a source connected to an array power supply, a drain connected to node C2 and a gate connected to node C1.

Transfer gates (Qn31 and Qn32) may each be a NMOS transistor. Transfer gate Qn31 has a first source/drain terminal connected to bit line BL1, a second source/drain terminal connected to node C1, and a control gate connected to word line WL. Transfer gate Qn32 has a first source/drain terminal connected to bit line BL0, a second source/drain terminal connected to node C2, and a control gate connected to word line WL.

When data is written into memory cell 20, write circuit 30 applies a high voltage level to one bit line (BL0 and BL1) while applying a low level (ground or 0V) to the other bit line (BL0 or BL1) while a word line driver (not shown) applies a high potential to word line WL (thus selecting memory cell 20).

As an example, assuming data is stored in memory cell 20 so that node C1 has a high level and node C2 has a low level. A low level on node C2 is inverted by inverter 21 to keep node C1 high and the high level on node C1 is inverted by inverter 22 to keep node C2 low. In this way, the data is latched and stored in memory cell 20.

Now, assuming opposite data is written into memory cell 20. Word line WL is driven high, thus turning on transfer gates (Qn31 and Qn32). Write circuit 30 then applies a low level to bit line BL1 and a high level to bit line BL0. Because transfer gates (Qn31 and Qn32) are NMOS transistors, they provide an efficient pull down, but an inefficient pull up capability. Thus, the high level applied to bit line BL0 hardly contributes to the writing. The low level applied to bit line BL1 pulls node C1 towards the ground potential through transfer gate Qn31. Once node C1 is driven below a threshold voltage of inverter 22, inverter 22 pulls node C2 towards the high level.

When data is read from memory cell 20, word line WL is driven high and transfer gates (Qn31 and Qn32) are turned on. With transfer gates (Qn31 and Qn32) turned on, memory cell 20 will drive bit lines (BL0 and BL1) in accordance with a stored data value. For example, assuming node C1 is at a low level and node C2 is at a high level, the low level at node C1 pulls down bit line BL1 while bit line BL2 may remain at a precharged high level. The signals on bit lines (BL0 and BL1) are then amplified by a sense amplifier (not shown). In this way, data stored in memory cell 20 is read out and provided externally from conventional SRAM 10.

In a SRAM memory cell, a threshold voltage $V_{TH}$ of the NMOS transistors are set relatively high in order to prevent data from being disturbed due to noise. However, if the threshold voltage $V_{TH}$ is set too high, the time required for data to be written into the memory cell can become excessive. As an example, when the power supply voltage (VDD) of the memory cell array is 1.2 V, then the threshold voltage $V_{TH}$ is set to about 0.5 V.

When a conventional SRAM 10 as illustrated in FIG. 4 operates at a low power voltage (such as VDD=1.2V), any variations of applied signals from the power supply level or ground level can have considerable effects on the operation.

For example, assume data is to be written to memory cell 20 such that bit line BL0 is at a high level and bit line BL1 is at a low level. Word line WL is driven to a high level. However, due to a resistance of the bit line, the low level of bit line BL1 may be above the ground level. In this case, the current drive (pull down) of transfer gate Qn31 is reduced. Assuming memory cell 20 originally stored opposite data to what is being written, the potential at node C1 is determined by a ratio of the current drive (pull-up strength) of PMOS transistor Qp1 versus the current drive (pull-down strength) of transfer gate Qn31. With the current drive of transfer gate Qn31 reduced, the time required to switch node C1 from a high level to a low level can become excessive. Also, because inverter 22 drives node C2 based on the logic level of node C1, the time required to switch node C1 from a low level to a high level can also become excessive. Thus, the overall write cycle time of conventional SRAM 10 may be adversely affected.

Figure 5:
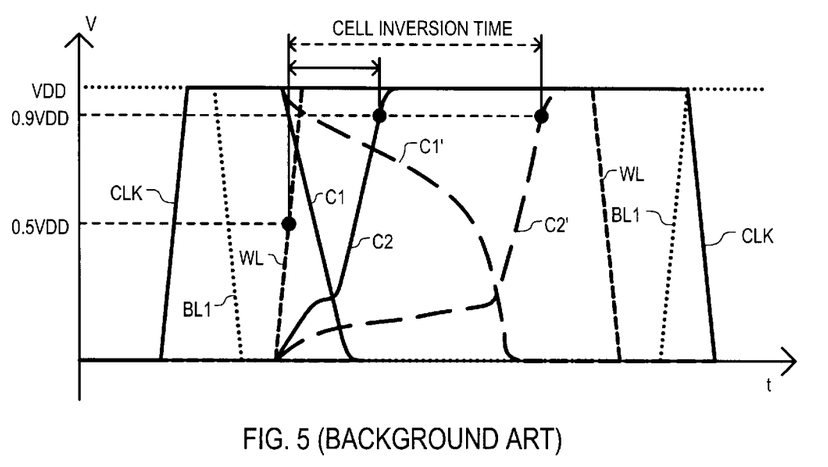
FIG. 5 is a timing diagram illustrating writing data into a memory cell in a conventional SRAM under various conditions.

FIG. 5 is a timing diagram illustrating writing data into memory cell 20 in conventional SRAM 10 under various conditions.

FIG. 5 includes a clock signal CLK (a timing clock necessary for the proper operation of the SRAM), word line WL signal, and bit line BL1 signal. Lines (C1 and C2) indicate signals at nodes (C1 and C2), respectively, when bit line BL1 is driven completely to the ground potential (0.0 V) during a write operation. Lines (C1' and C2') indicate signals at nodes (C1 and C2), respectively, when bit line BL1 is driven only to 0.2 V over the ground potential. In this case, the time (cell inversion time) between a mid-point (0.5 VDD) of a high transition of the word line WL and a 90 percent point (0.9 VDD) of a transition of node C2 (line C2') to a high level is much longer than the case (line C2) when bit line BL1 is driven to the ground potential. If the potential of the low going bit line (in this case bit line BL1) is much higher than 0.2 V, the memory cell 20 may not even properly receive the write data.

As mentioned above, transistors in the SRAM cells are manufactured to be as small as reasonably possible in order to minimize the SRAM cell size to allow higher memory capacity and/or reduce chip size. However, when the transistor sizes are reduced, the transistor performance variations in transistor characteristics may increase. For example, an SRAM having a memory capacity of 1 Mbit may include a 5σ Intrinsic Vth fluctuation among transistors, where σ represents the standard deviation. In order to keep a sufficiently high yield, it is necessary to for the design to tolerate a 6σ Intrinsic Vth fluctuation among transistors.

Figure 6:
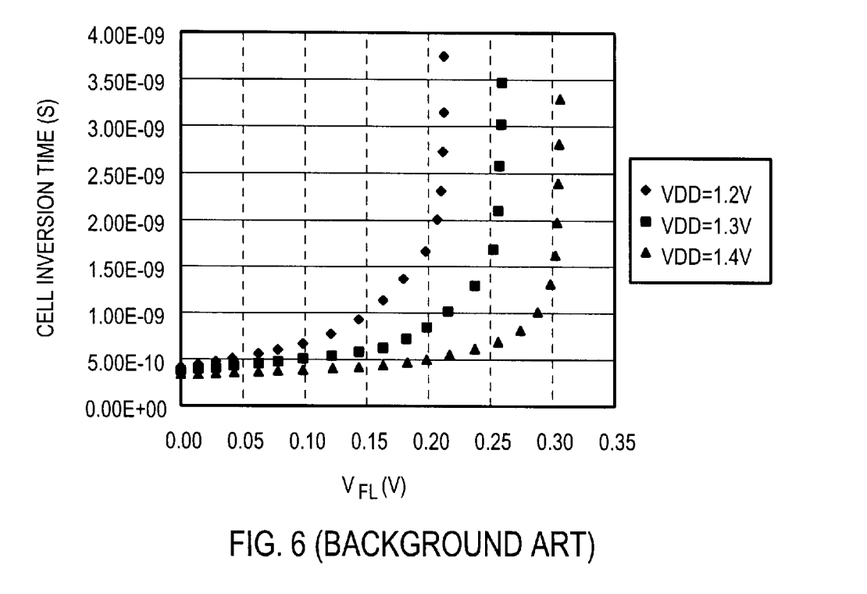
FIG. 6 is a graph illustrating cell inversion times in an opposite data write in a memory cell for various power supply voltages versus a low (write) potential of a bit line.
Figure 7:
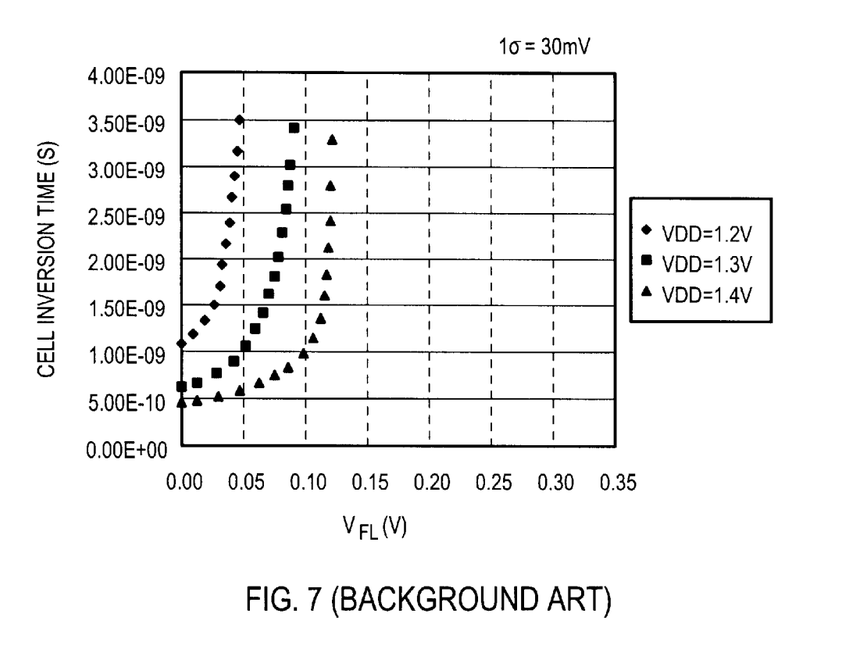
FIG. 7 is a graph illustrating cell inversion times in an opposite data write in a memory cell for various power supply voltages versus a low (write) potential of a bit line when threshold voltages suffer process variations 6σ.

FIGS. 6 and 7 are graphs illustrating cell inversion times in an opposite data write in a memory cell for various power supply voltages versus a low (write) potential of a bit line. FIG. 6 illustrates a cell inversion time when there are no Intrinsic Vth fluctuation among transistors. FIG. 7 illustrates a cell inversion time when the Intrinsic Vth fluctuation among transistors is as much as 6σ, where σ is 30 mV.

As shown in FIG. 6 (no Intrinsic Vth fluctuation), when the power supply (VDD) is 1.2 V, the time required for cell inversion (a 90 percent point (0.9 VDD) of a transition of node (N1 or N2) to a high level) is not unduly long as long as the potential $V_{FL}$ (bit line potential) is equal to or less than about 0.20 V. However, as illustrated in FIG. 7 (a 6σ Intrinsic Vth fluctuation), when the power supply (VDD) is 1.2 V, the time required for cell inversion (a 90 percent point (0.9 VDD) of a transition of node (N1 or N2) to a high level) is unduly long even when the potential $V_{FL}$ (bit line potential) is about 0.05 V. As illustrated in FIGS. 6 and 7, the tolerance for variations in transistor performance when writing data into a memory cell is reduced. Thus, the yield of a conventional semiconductor device, such as a conventional SRAM 10 may decline.

In view of the above discussion, it would be desirable to provide a method for writing data into a semiconductor memory device in which data may be securely written into a memory cell and a semiconductor memory device therefore. It would also be desirable to provide the method in which data may not be disturbed even when the device operates using a low power voltage and a semiconductor memory device therefore.

SUMMARY OF THE INVENTION

According to the present embodiments, method of writing data into a semiconductor memory device including a memory cell to which a power supply potential and a ground potential are provided is disclosed. The method may include generating a negative voltage lower than the ground potential and providing complementary data signals to a bit line pair when writing data to a memory cell wherein the low one of the complementary data signals is essentially the negative voltage. In this way, compensation for a potential increment which may be caused due to a wiring resistance, or the like, of a bit line may be provided.

According to one aspect of the embodiments, a semiconductor memory device may include a memory cell to which a power supply potential and a ground potential are provided. A first and second bit line may be coupled to the memory cell. A method of writing data into the semiconductor memory device may include the steps of generating a negative voltage lower than the ground potential and providing complementary data signals to the first and second bit lines when writing data to the memory cell. The low one of the complementary data signals may be essentially the negative voltage.

According to another aspect of the embodiments, a method of writing data into the semiconductor memory device may include the step of providing the ground potential to the one of the first and second bit lines receiving the low one of the complementary data signals before providing the negative voltage.

According to another aspect of the embodiments, a semiconductor memory device may include a memory cell to which a power supply potential and a ground potential are provided. The memory cell may be coupled to a first and second bit line. A voltage dropping circuit may generate a negative voltage lower than the ground potential. A write circuit may provide complementary data signals to the first and second bit lines when writing data to the memory cell. The low one of the complementary data signals may be essentially the negative voltage.

According to another aspect of the embodiments, the memory cell may include a transfer gate that is turned on when data is being written to the memory cell and then turned off after the writing of data is completed. A precharge potential may be applied to the first and second bit lines after the transfer gate is turned off.

According to another aspect of the embodiments, the precharge potential may be essentially the power supply potential.

According to another aspect of the embodiments, the negative voltage may be less than or equal to a forward bias voltage of a PN junction.

According to another aspect of the embodiments, the semiconductor memory device may be a static random access memory (SRAM).

According to another aspect of the embodiments, a pulse delivering circuit may provide a low pulse when writing data into the memory cell. A capacitor may be coupled to receive the low pulse and provide the negative voltage.

According to another aspect of the embodiments, a semiconductor memory device may include an array of memory cells arranged into rows and columns. Each memory cell may receive a power supply potential and a ground potential. Each column of memory cells may be coupled to a first and second bit line. A write circuit may provide complementary data signals to the first and second bit lines coupled to a first one of the columns of memory cells when writing data to a first memory cell in the first one of the columns of memory cells. The low one of the complementary data signals may be a negative voltage below the ground potential.

According to another aspect of the embodiments, the write circuit may include a voltage dropping circuit. The voltage dropping circuit may provide the negative voltage to a predetermined one of the first and second bit lines in accordance with a data value to be written.

According to another aspect of the embodiments, a selector circuit may be coupled between the write circuit and a plurality of the columns of memory cells. The selector circuit may provide an electrical connection between the write circuit and the first one of the columns of memory cells during writing data to the first memory cell.

According to another aspect of the embodiments, the selector may provide the electrical connection in response to a predetermined address value.

According to another aspect of the embodiments, each of the memory cells may include a first insulated gate field effect transistor (IGFET) coupled to the first bit line and a second IGFET coupled to the second bit line. The first and second IGFETs may provide a data path to write data to the memory cell.

According to another aspect of the embodiments, each of the memory cells may further include first and second inverters forming a latch for storing a data value.

According to another aspect of the embodiments, the first and second IGFETs may be n-type IGFETs.

DETAILED DESCRIPTION OF THE EMBODIMENTS

Various embodiments of the present invention will now be described in detail with reference to a number of drawings.

Figure 1:
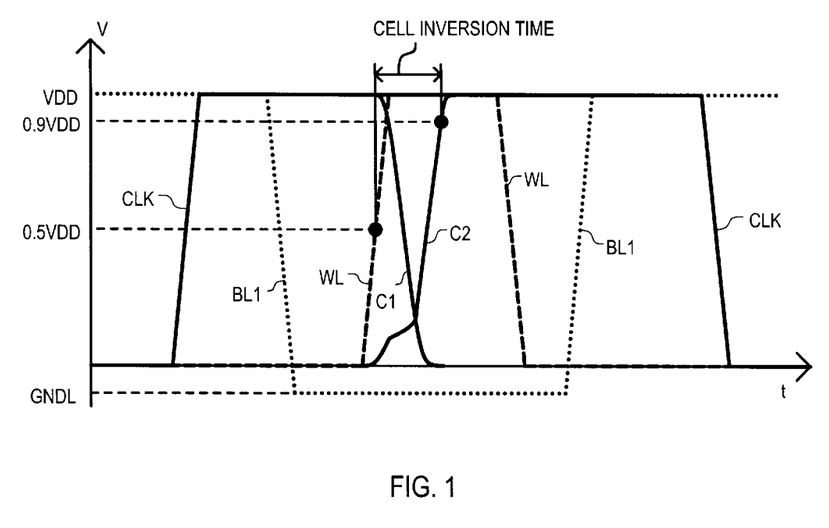
FIG. 1 is a waveform diagram illustrating a write operation of a SRAM (static random access memory) according to an embodiment.

FIG. 1 is a waveform diagram illustrating a write operation of a SRAM (static random access memory) according to an embodiment.

FIG. 1 includes a clock signal CLK (a timing clock that may be necessary for the proper operation of the SRAM), word line WL signal, and bit line BL1 signal. Lines (C1 and C2) indicate signals at nodes (C1 and C2) of a memory cell, respectively. The memory cell may be a memory cell, such as memory cell 20 in FIG. 4. The signals as illustrated in FIG. 1 may be similar when data is written into any memory cell in an array of memory cells. Bit line BL1 signal may be similar to a bit line BL0 signal (complementary bit line) when opposite data is written to a memory cell.

As shown in FIG. 1, when performing a write operation, a write circuit may provide a negative voltage GNDL to a bit line BL1. Negative voltage GNDL may be lower than the ground potential (0 V). A write circuit may include a voltage dropping circuit (not illustrated in FIG. 1) for supplying negative voltage GNDL to the write circuit in order to drive the bit line (BL1 or BL0) in accordance with the desired write data value.

A semiconductor memory device according to the present invention my include memory cells configured in the same manner as memory cell 20 in FIG. 4. As such, a description of the memory cell will be omitted. A semiconductor memory device according to the present invention may include similar constituents as conventional SRAM 10 and such similar constituents may be referred to by the same reference character.

As illustrated in FIG. 1, during a write operation, a negative voltage GNDL may be applied to a predetermined bit line (for example bit line BL1) in accordance with a desired data value to be written into a memory cell. A negative voltage GNDL may be applied to a predetermined bit line BL1 after a timing clock CLK transitions to a high level.

Subsequently, when a high level is applied to a word line WL, a memory cell is selected (transfer gates (Qn31 and Qn32) are turned on) and a low level is applied to a node C1 of the memory cell.

Because a negative voltage GNDL is supplied from a write circuit to a bit line BL1, compensation for a potential increment which may be caused due to a wiring resistance, or the like, of bit line BL1 may be provided. In this way, the potential level at a source/drain terminal connection of transfer gate Qn31 with bit line BL1 may be prevented from raising above the ground potential (0 V). Accordingly, current drive of transfer gate Qn31 may be improved and the potential at node C1 of the memory cell 20 may be pulled to ground (0 V) more rapidly and the potential at node C1 may be switched to a high (VDD). This may prevent the writing time of data into a memory cell at low voltage operations from being excessively long.

If the negative voltage GNDL is kept within a range at which transfer gates (Qn31 and Qn32) may safely operate even with a considerable variation in threshold voltages, it may be possible to improve the fabrication yield of the memory devices. However, it is preferable to keep the magnitude of the negative voltage GNDL applied to the bit line below a level at which parasitic diodes in transfer gates (Qn31 and Qn32) will be turned on. Thus, the maximum magnitude of the negative voltage GNDL may be kept less than about 0.5 V to prevent PN junctions from being forward biased. If the magnitude of negative voltage GNDL is kept less than the forward bias voltage of the PN junction, it may be possible to safely apply the negative voltage GNDL to a bit line (BL0 or BL1) without modifying the structure of the SRAM or modifying the fabrication process.

Another method that may increase the drive strength of transfer gates (Qn31 and Qn32) is to provide an increased voltage higher than power supply VDD to word line WL.

With the above method where an increased voltage is applied to the word line WL, all transfer gates connected to the word line WL will receive the increased voltage higher than the power supply VDD. In this case, all transfer gates (Qn31 and Qn32) in a selected row of memory cells receive the stress condition during a write operation. However, when only a negative voltage GNDL is applied to a bit line (BL0 or BL1), transfer gates (Qn31 and Qn32) in the memory cell 20 connected to bit line (BL0 or BL1) may receive a stress condition. According to this method, only the transfer gates (Qn31 and Qn32) in the memory cell 20 that receives write data may be exposed to the stress condition during a write operation. In this way, a stress condition may be applied to fewer memory cells 20 when a negative voltage GNDL is applied to a bit line (BL0 or B11) instead of an increased voltage being applied to a word line WL. Accordingly, the method of this invention may prevent the lifetime of an SRAM from being unduly shortened as compared to a method in which an increased voltage is applied to a word line WL.

Also, when a method where an increased voltage is applied to a word line WL is implemented, a voltage increasing circuit may be necessary for each word line because undesired affects may occur when more than one word line simultaneously receives an increased voltage. However, according to a method of the invention where a negative voltage is applied to a bit line (BL0 or BL1), a voltage dropping circuit may distribute a negative voltage GNDL to a plurality of bit lines. For example, a voltage dropping circuit may be distributed among eight bit lines while only a selected bit line may receive a negative voltage GNDL. In this way, a current drive of transfer gates (Qn31 and Qn32) may be improved while requiring a limited circuit area.

The write circuit of a semiconductor memory device according to the embodiments will now be described with reference to FIG. 2.

Figure 2:
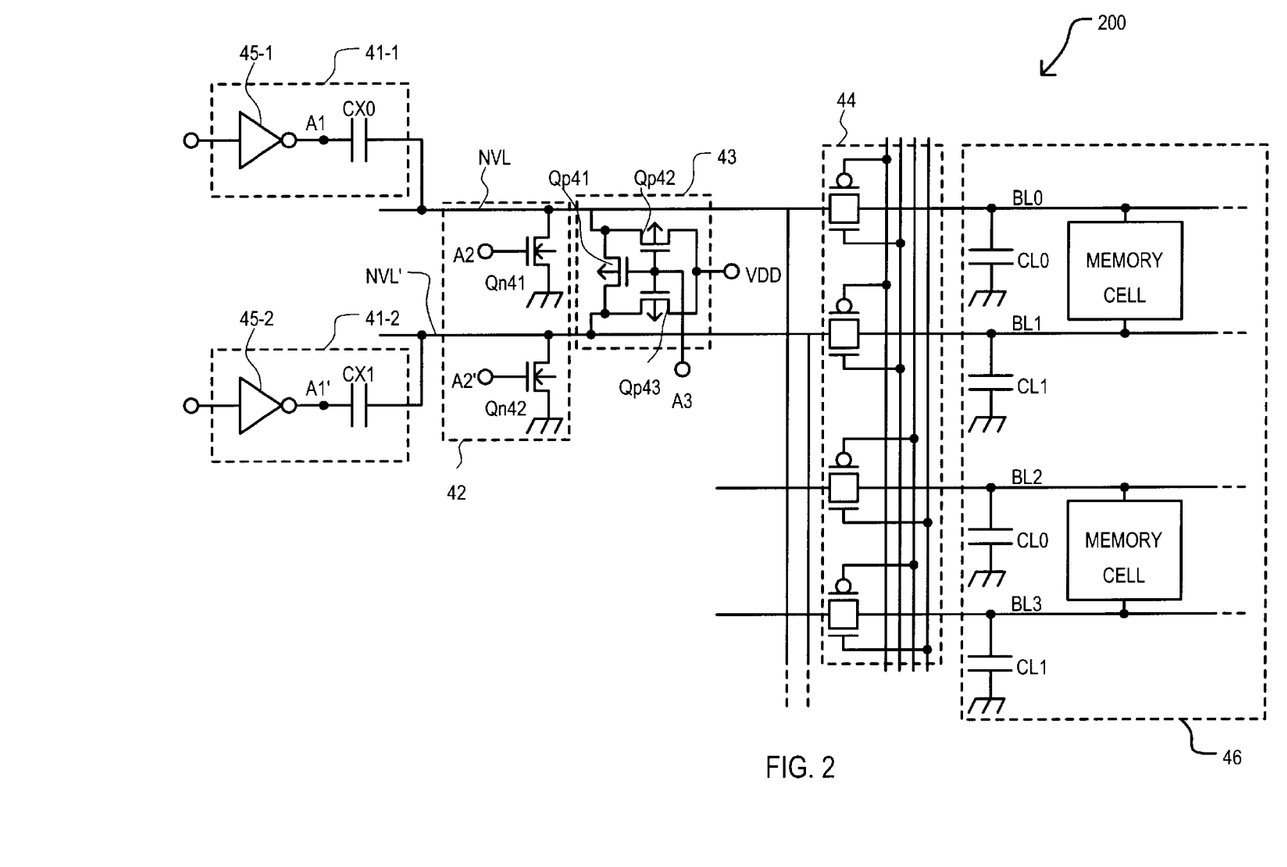
FIG. 2 is a circuit schematic diagram illustrating one configuration of a voltage dropping circuit and write circuit of a portion of a semiconductor memory device according to an embodiment.

FIG. 2 is a circuit schematic diagram illustrating one configuration of a voltage dropping circuit and write circuit of a portion of a semiconductor memory device 200 according to an embodiment.

Semiconductor memory device 200 may include voltage dropping circuits (41-1 and 41-2), a write circuit 42, a precharge circuit 43, a y selector portion 44, and memory cell array 46.

Voltage dropping circuits (41-1 and 41-2) may generate a negative voltage GNDL in accordance with a data value to be written into a selected memory cell. For example, if a data zero is to be stored in a selected memory cell, voltage dropping circuit 41-1 may generate a negative voltage GNDL, however, if a data one is to be stored in a selected memory cell, voltage dropping circuit 41-2 may generate a negative voltage GNDL. Voltage dropping circuit 41-1 may include an inverter 45-1 providing an output to a capacitor CX0 at node A1. Capacitor CX0 may have another terminal connected to a node NVL. Voltage dropping circuit 41-2 may include an inverter 45-2 providing an output to a capacitor CX1 at node A1'. Capacitor CX1 may have another terminal connected to a node NVL'. Inverter (45-1 or 45-2) may deliver a pulse to a respective capacitor (CX0 or CX1) when a negative voltage is to be applied to a respective node (NVL or NVL').

Write circuit 42 may include transistors (Qn41 and Qn42). Transistor Qn41 may have a source connected to ground, a drain connected to node NVL, and a gate connected to receive a signal at node A2. Transistor Qn42 may have a source connected to ground, a drain connected to node NVL', and a gate connected to receive a signal at node A2'. Transistors (Qn41 and Qn42) may be IGFETs and, more particularly, may be N-type IGFETs such as NMOSFETs. Write circuit 42 may provide a ground potential to a predetermined node (NVL or NVL') in accordance with a desired write data value. For example, if a data zero is to be stored in a selected memory cell, write circuit 42 may provide a ground potential to node NVL, however, if a data one is to be stored in a selected memory cell, write circuit 42 may provide a ground potential to node NVL'.

Precharge circuit 43 may receive an input at node A3 and may precharge nodes (NVL and NVL') to a high level and thereby precharge bit lines BL to the high level. In this case, a high level may be a power supply voltage VDD. Precharge circuit 43 may include transistors (Qp41, Qp42, and Qp43). Transistor Qp41 may have one drain/source connected to node NVL, another drain/source connected to node NVL', and a gate connected to node A3. Transistor Qp42 may have a source connected to a power supply voltage VDD, a drain connected to node NVL, and a gate connected to node A3. Transistor Qp43 may have a source connected to a power supply voltage VDD, a drain connected to node NVL', and a gate connected to node A3. Transistor Qp41 may be considered as an equalizing device to ensure nodes (NVL and NVL') are precharged to essentially the same potential. Transistors (Qp42 and Qp43) may be considered as precharge potential providing devices. Transistors (Qp41, Qp42, and Qp43) may be IGFETs and, more particularly, may be P-type IGFETs such as PMOSFETs.

Y-selector portion 44 may selectively connect nodes (NVL and NVL') to a bit line pair (BL0–BL1 or BL2–BL3), respectively, in accordance with a received address value, such as a column address value. In this way, a negative voltage GNDL may be applied to a selected bit line (BL0 or BL1), for example, of a bit line pair (BL0–BL1) in order to improve a write time of a data value to a memory cell 20.

The operation of semiconductor memory device 200 during a write operation will now be described with reference to FIG. 2 in conjunction with FIG. 3.

Figure 3:
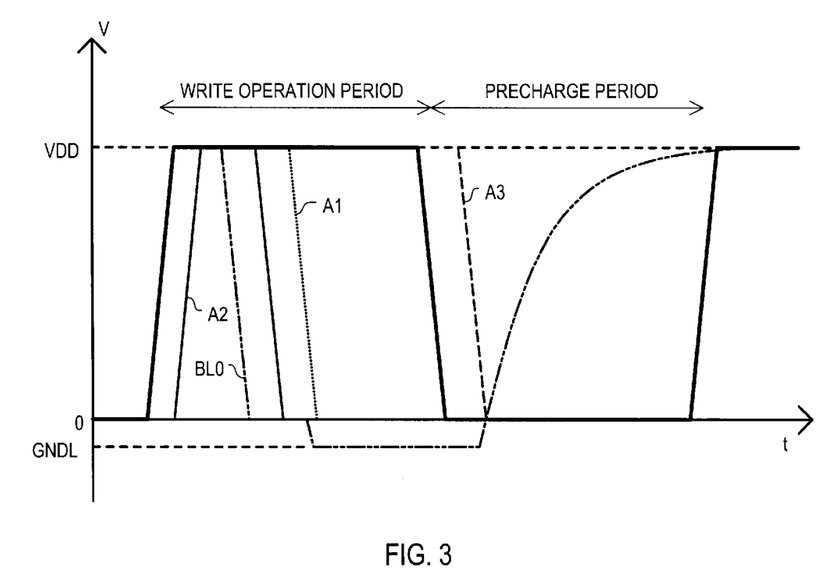
FIG. 3 is a waveform diagram illustrating the operation of the voltage dropping circuit and write circuit of FIG. 2.

FIG. 3 is a waveform diagram illustrating the operation of the voltage dropping circuit and write circuit of FIG. 2. FIG. 3 illustrates a case when a negative voltage GNDL is applied to bit line BL0. A negative voltage GNDL may be applied to another bit line (for example bit line BL1) in a similar manner when opposite data is to be written into a selected memory cell.

Referring now to FIG. 3, during a write operation, a timing clock CLK may switch to a high level. Timing clock CLK may be a clock signal triggering an SRAM operation and in this case a write operation. Y-selector portion 44 may be subsequently activated and may electrically connect a bit line pair respectively to nodes (NVL and NVL'). In this case, bit line BL0 may be electrically connected to node NVL and bit line BL1 may be electrically connected to node NVL'. A signal at node A2 may go high, and transistor Qn41 within write circuit 42 may be turned on so that a ground potential may be applied to node NVL and bit line BL0 (through Y-selector portion 44).

Subsequently, the signal at node A2 may go low to turn off transistor Qn41. Node NVL and bit line BL0 may be in a floating condition. In this case, write data may be a data zero. Thus, the output of inverter 45-1 (node Al) within voltage dropping circuit 41-1 may transition from a high level to a low level. When node A1 goes low, node NVL (and bit line BL0) may go low to a negative voltage due to capacitive coupling of capacitor CX0. In this way, voltage dropping circuit 41-1 may provide a negative voltage GNDL to bit line BL0.

With bit line BL0 at a negative voltage GNDL, a data value may be written into a memory cell 20 without an unduly long write time.

Timing clock CLK may then transition low during a subsequent precharge period. An input (node A3) to precharge circuit 43 may then go low. With node A3 low, transistors (Qp41, Qp42, and Qp43) may be turned on and a power supply voltage VDD may be applied to bit line BL0.

By precharging bit lines (BL0 and BL1) high, bit line capacitances (CL0 and CL1) may be properly charged and the negative voltage may be removed so that semiconductor memory device 200 may be set up for a subsequent read or write operation to occur.

Voltage dropping circuits (41-1 and 41-2) may receive complementary data signals as inputs. Similarly, signals (A2 and A2') received by write circuit 42 may be complementary data signals. Voltage dropping circuits (41-1 and 41-2) may be considered to be a portion of a write circuit providing write data to a memory cell array 46. Likewise, Y-selector portion 44 may be considered to be a portion of a write circuit by selecting a column (bit line pair) within memory cell array 46 to receive write data.

According to the embodiments, a semiconductor memory device may include a method in a write operation to compensate for a potential increment over a ground potential which may otherwise develop due to a bit line wiring resistance. A negative potential lower than a ground potential may be applied to a bit line into which low data is to be written. With a negative potential applied to a bit line, the current drive strength of a transfer gate may be improved. In this way, a memory cell inversion time may be shortened and it may be possible to obtain a semiconductor memory device having improved operating speed yields.

Further, if the negative potential is kept within a predetermined range, undesirable affects may be reduced even if transfer gates have a considerable variation in their threshold voltages and an overall manufacturing yield of semiconductor memory devices may be improved. Particularly, it may be possible to apply a negative voltage to a bit line during a write operation without modifications of the SRAM structure or modifications in the fabrication process.

It may further be possible to remove charge (negative potential) accumulated on a capacitive component of the bit line and provide a precharge on the same component by applying a power supply voltage to the bit line for a predetermined period after the writing of data into the memory cell is completed.

It is understood that the embodiments described above are exemplary and the present invention should not be limited to those embodiments. Specific structures should not be limited to the described embodiments.

For example, memory cell array 46 may include a plurality of memory cells arranged in a matrix. Each memory cell may be connected to a complementary bit line pair. For example, bit lines (BL0 and BL1) may be a complementary bit line pair. During a write operation, complementary data signals may be provided on bit lines (BL0 and BL1). The low data signal may be provided on one of bit lines (BL0 or BL1) in the form of a negative potential. The high data signal may be provided on the other one of bit lines (BL0 or BL1) in the form of a power supply potential VDD.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of writing data into a semiconductor memory device including a memory cell to which a positive power supply potential and a ground potential are provided and the memory cell is coupled to a first and second bit line, comprising the steps of:

generating a negative voltage lower than the ground potential; and providing complementary data signals to the first and second bit lines when writing data to the memory cell wherein the low potential one of the complementary data signals is essentially the negative voltage.

2. The method of writing data into a semiconductor memory device according to claim 1, wherein:

the memory cell includes a transfer gate that is turned on when data is being written to the memory cell and then turned off after the writing of data is completed; and a precharge potential is applied to the first and second bit lines after the transfer gate is turned off.

3. The method of writing data into a semiconductor memory device according to claim 2, wherein:

the precharge potential is essentially the positive power supply potential.

4. The method of writing data into a semiconductor memory device according to claim 1, wherein:

the negative voltage is less than or equal to a forward bias voltage of a PN junction.

5. The method of writing data into a semiconductor memory device according to claim 1, wherein:

the semiconductor memory device is a static random access memory.

6. The method of writing data into a semiconductor memory device according to claim 1, further including the step of:

providing the ground potential to the one of the first and second bit lines receiving the low one of the complementary data signals before providing the negative voltage.

7. A semiconductor memory device including a memory cell to which a power supply potential and a ground potential are provided and the memory cell is coupled to a first and second bit line, the semiconductor memory device comprising:

a voltage dropping circuit generating a negative voltage lower than the ground potential; and a write circuit providing complementary data signals to the first and second bit lines when writing data to the memory cell wherein the low potential one of the complementary data signals is essentially the negative voltage.

8. The semiconductor memory device according to claim 7, wherein:

the memory cell includes a transfer gate that is turned on when data is being written to the memory cell and then turned off after the writing of data is completed; and a precharge potential is applied to the first and second bit lines after the transfer gate is turned off.

9. The semiconductor memory device according to claim 8, wherein:

the precharge potential is essentially the power supply potential.

10. The semiconductor memory device according to claim 7, wherein:

the write circuit provides the ground potential to the one of the first and second bit lines receiving the low one of the complementary data signals before providing the negative voltage.

11. The semiconductor memory device according to claim 7, wherein the voltage dropping circuit includes:

a pulse delivering circuit providing a low pulse when writing data into the memory cell; and a capacitor coupled to receive the low pulse and provide the negative voltage.

12. The semiconductor memory device according to claim 7, wherein:

the negative voltage is less than or equal to a forward bias voltage of a PN junction.

13. The semiconductor memory device according to claim 7, wherein:

the semiconductor memory device is a static random access memory.

14. A semiconductor memory device, comprising:

an array of memory cells arranged into rows and columns, each memory cell receiving a positive power supply potential and a ground potential;

each column of memory cells coupled to a first and second bit line; and a write circuit providing complementary data signals to the first and second bit lines coupled to a first one of the columns of memory cells when writing data to a first memory cell in the first one of the columns of memory cells wherein the low potential one of the complementary data signals is a negative voltage below the ground potential.

15. The semiconductor memory device according to claim 14, wherein the write circuit includes:

a voltage dropping circuit providing the negative voltage to a predetermined one of the first and second bit lines coupled to the first one of the columns of memory cells in accordance with a data value to be written.

16. The semiconductor memory device according to claim 15, further including:

a selector circuit coupled between the write circuit and a plurality of the columns of memory cells to provide an electrical connection between the write circuit and the first one of the columns of memory cells during writing data to the first memory cell.

17. The semiconductor memory device according to claim 16, wherein:

the selector circuit provides the electrical connection in response to a predetermined address value.

18. The semiconductor memory device according to claim 14, wherein:

each of the memory cells include a first insulated gate field effect transistor (IGFET) coupled to the first bit line and a second IGFET coupled to the second bit line providing a data path to write data to the memory cell.

19. The semiconductor memory device according to claim 18, wherein:

each of the memory cells further include first and second inverters forming a latch for storing a data value.

20. The semiconductor memory device according to claim 19, wherein:

the first and second IGFETs are n-type IGFETs.

* * * * *